(12) United States Patent
Selbach

(10) Patent No.: US 8,069,556 B2
(45) Date of Patent: Dec. 6, 2011

(54) CABLE HARNESS PRODUCTION SYSTEM

(76) Inventor: Dirk Selbach, Rottendorf (DE)

( * ) Notice: Subject to any disclaimer, the term of this patent is extended or adjusted under 35 U.S.C. 154(b) by 0 days.

(21) Appl. No.: 12/602,077

(22) PCT Filed: Apr. 5, 2008

(86) PCT No.: PCT/DE2008/000578
§ 371 (c)(1),
(2), (4) Date: May 14, 2010

(87) PCT Pub. No.: WO2008/145081
PCT Pub. Date: Dec. 4, 2008

(65) Prior Publication Data
US 2010/0281684 A1    Nov. 11, 2010

(30) Foreign Application Priority Data

May 25, 2007    (DE) .......................... 10 2007 024 476

(51) Int. Cl.
*B23P 19/00*    (2006.01)
(52) U.S. Cl. ............... 29/755; 29/33 F; 29/747; 29/857; 324/66
(58) Field of Classification Search ............ 29/745–749, 29/825, 33 M; 174/110 R; 324/66, 538–539
See application file for complete search history.

(56) References Cited

U.S. PATENT DOCUMENTS

| 3,930,307 | A | * | 1/1976 | Schotthoefer et al. | .......... 29/593 |
| 4,030,029 | A | * | 6/1977 | Cox | ................................ 324/66 |
| 4,218,745 | A | | 8/1980 | Perkins | |
| 5,438,506 | A | * | 8/1995 | Oho et al. | ........................ 700/9 |
| 5,535,788 | A | | 7/1996 | Mori et al. | |
| 6,125,532 | A | * | 10/2000 | Takada | ............................ 29/857 |
| 6,195,884 | B1 | * | 3/2001 | Miyamoto et al. | ............... 29/857 |

FOREIGN PATENT DOCUMENTS

| DE | 102 18 411 A1 | 11/2003 |
| EP | 0300141 A | 1/1989 |

* cited by examiner

*Primary Examiner* — Minh Trinh
(74) *Attorney, Agent, or Firm* — Edwin D. Schindler

(57) ABSTRACT

A cable harness production system includes an electronic controller and at least one installation plate to which a plurality of mounting stations is fastened. Each of the mounting stations supports a receptacle for a functional element, which is directly connected to at least one cable harness or is shaped as a cable installation aid, such as a fork. In at least one mounting station, at least one electronic transmitter is integrated with a test sensor which can be activated by the mounting of a functional element, or by the insertion of a cable into the cable installation aid, so that a test message, as an electric wave, can be emitted and can be received and evaluated by the electronic controller.

15 Claims, 1 Drawing Sheet

CABLE HARNESS PRODUCTION SYSTEM

BACKGROUND OF THE INVENTION

1. Technical Field of the Invention

Figure 1:
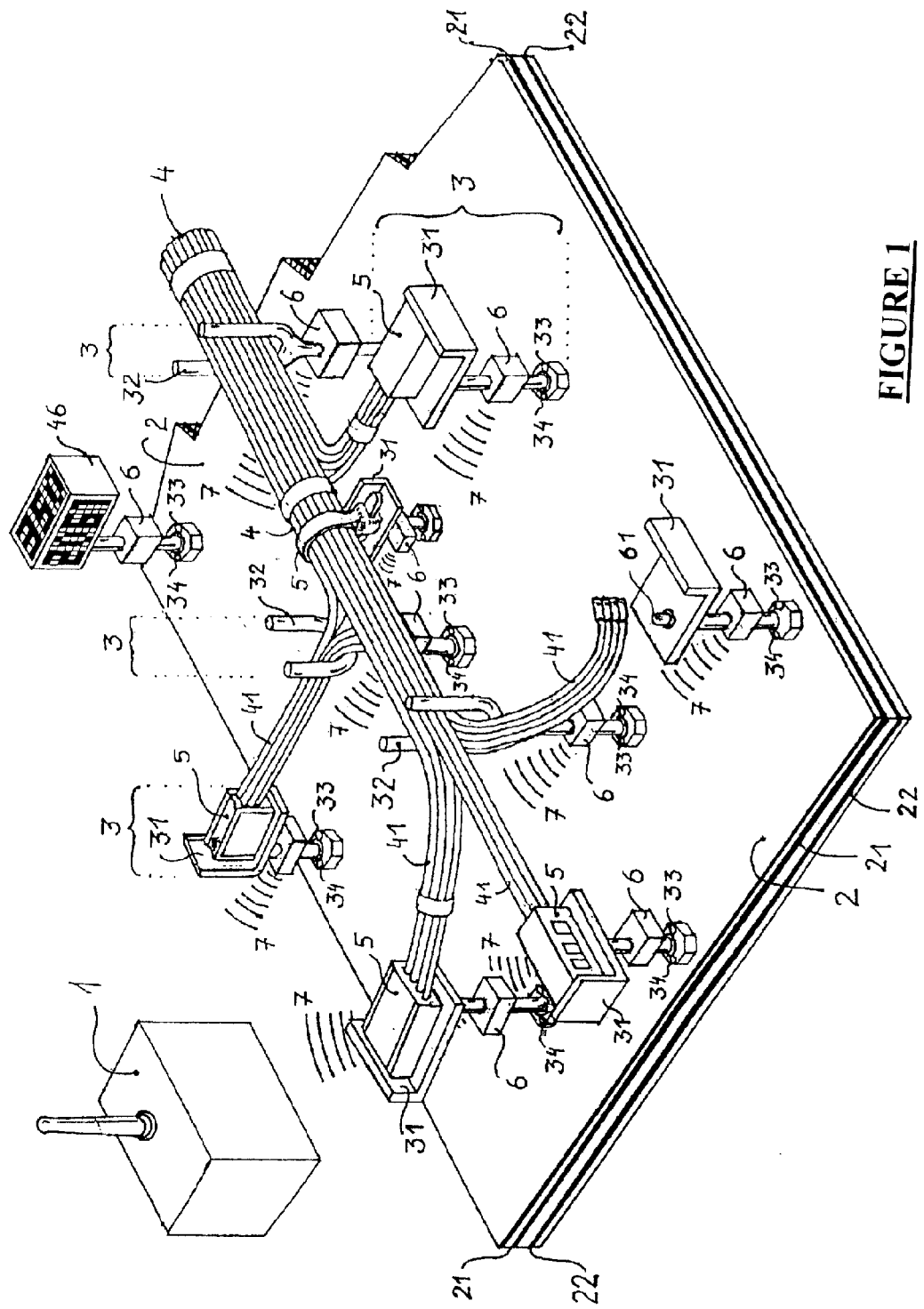

The invention relates to a cable harness production system comprising an electronic controller and at least one installation plate to which a plurality of mounting stations are fastened, each of said mounting stations supporting a receptacle for a functional element, which is directly connected to at least one cable of the cable harness, or is shaped as a cable installation aid, e.g. as a fork.

A cable harness is a length of cables that transmit signals for information or electrical power for energy supply. By the term "cable" here is meant, besides wires of copper, aluminium or other metals sheathed with insulating material, also coaxial cables, hollow waveguides and optical waveguide cables, such as glass-fibre cables or else steel twisted cables. The cables are held together by means of clips, cable straps, conduits or similar means and the finished cable harness connects together a plurality of functional elements such as plugs, connectors, switches or lights. The form of the cable harness is often to be adapted to specific spatial requirements on installation.

2. Description of the Prior Art

Numerous cable harnesses are used in automotive engineering, but also for electrical equipment, and those used, for example, in cars according to the state of the art can contain cables with a total length of several kilometers. Due to possible variants of the electrical equipment, a number of different cable harnesses is necessary even for vehicles that are otherwise the same or for the same devices.

The cables are assembled on a special workbench or on an installation board to form a cable harness, clamped together, wound or otherwise mechanically joined and electrically connected at their end points to the functional elements. In the prior art, the functional elements are retained in the receptacles of mounting stations and arranged on the installation plate and cable laying aids are arranged on the installation plate for guiding and angling the cables. In the simplest case, pins are used, which are partly hammered into the installation plate, in the prior art, however, column-like elements that support a fork or a guide angle as receptacle.

In the prior art, various functional elements exist, which are adapted to integration in a cable harness. Thus, e.g. U.S. Pat. No. 5,945,635, Coutaro Suzuki describes a special cable joiner that rests in receptacles on a columnar mounting station.

The reason for the elevated arrangement of the functional elements is that tools must in some cases act from a multiplicity of sides of the functional element and that the cable harnesses must be wound with textile tape or holding clips are to be stuck on the cable harness.

Other necessary processing steps include the threading of wires into conduits or the attachment of contacts to the lines, in particular the connecting of one contact to two lines and the fitting of conduits one inside the other. Each of these processing steps requires partly complex movement sequences, in which numerous possible errors open up. A further risk for production errors is the complexity of the overall structure of the cable harness.

Also to reduce these errors, it is an obvious step to automate the laying of cables and their connection to the functional elements, that is to say to have them performed, e.g., by robots.

European Patent EP 0300141 describes an industrial robot that fully automatically lays cables on an installation board and joins them. However, the disadvantage is the high investment for the robot, its connection to the installation plate and the continuous new programming for each individual cable harness and its variants. In particular for low production rates and individual parts of cable harnesses, it is therefore still economically appropriate to produce cable harnesses predominantly manually on installation boards with suitable auxiliary equipment.

The high complexity of most cable harnesses and the, in principle, higher defect quota for manual instead of automated work causes a comparatively high defect quota for cable harness production. Therefore, in the prior art, checking of the finished cable harness is unavoidable. The test set-up conventionally used at present are auxiliary cables arranged on the reverse side of the installation plate, by means of which a test instrument is connected to the ends of the cable harness just produced, as described inter alia in European Patent EP 0 300 141 and German Patent DE 939 341, Ulrich Kölm. A considerable disadvantage is that the laying of these auxiliary cables is very time consuming and, even with minor changes, work is often necessary not only in the vicinity of the auxiliary cables directly affected thereby, which after shifting of a portion become obstructions and therefore also have to be converted. The result of this is that in many cases the entire installation board has to be rebuilt.

SUMMARY OF THE INVENTION

Against this background it is the object of the invention to provide a mounting station for cable laying systems, which can be rapidly assembled and easily offset, and test results that can be acquired by means of a test sensor can be transferred to a master controller without the effort of an additional auxiliary cable harness.

As solution, the invention presents a cable harness production system in which, in at least one mounting station, at least one electronic transmitter is integrated with a test sensor, which can be activated by the mounting of a functional element or by the insertion of a cable into the cable installation aid, wherein a test message as electric wave can be emitted and can be received and be evaluated by the controller.

The cable harness production system according to the invention is not only suitable for all types of electrical cable, but also for optical waveguides and all other at least partly flexible conduits or tubes for gases and liquids.

The gist of the invention is the combination of a test sensor for performing a test on the cable harness with subsequent transmission of the result to an electronic transmitter, which passes on the information to a receiving unit in the central controller. Test sensors for the most varied test sizes, in the most varied designs, are usable. An important group of the test concerns mechanical features.

Suitable test sensors include, e.g. mechanical switches, inductive or capacitive proximity initiators or forked light barriers.

A very simple characteristic is the presence of a functional element or a cable. However, it is also conceivable to check the particular type by means of special key definitions or to check particular dimensions. It is also conceivable to insert, e.g., an impermissibly large cable harness with cables placed impractically close together into a centring on a mounting station and, there, due to its oversize, to activate a mechanical sensor, which can transmit the message "oversize" to the controller by means of its associated electronic transmitter.

If, e.g., it is to be checked whether a functional element has actually been inserted in a receptacle or whether there is actually a cable in a cable installation aid, a pin could be used, which is pressed down against the force of a spring by the insertion of a functional element in a receptacle or the insertion of a cable in a cable installation aid, and is thereby triggered. The pin would thus have to be installed in the receptacle or in the cable installation aid, such that, in the unoccupied state, it projects out of a surface on which the functional element or the cable lies during insertion. This pin thus always triggers a message when it is pushed down.

In order not only to test that something has been inserted but also to monitor what was inserted, the pin can be mounted on the functional element instead of on the mounting station, so that, when the functional element is laid on the mounting station through an opening in the receptacle, it is pushed onto the test sensor.

This test presupposes that each functional element is generally equipped with a corresponding pin, however it has the great advantage that accidental or intentional false messages can only be triggered with great effort and an additional tool, so that a positive message is triggered not by just any functional element but only by that with the correct pin.

If a plurality of functional elements with the same pin are to be distinguished from one another, the pin can be profiled in a similar way to a mechanical key and the opening in the receptacle shaped complementary to this profile. In that case only the insertion of a suitable profile is possible and "incorrect" functional elements, whose pins have a different profile, are rejected.

DETAILED DESCRIPTION OF THE PREFERRED EMBODIMENTS

Another embodiment for a coding of the pins on the functional elements is the arrangement of the opening for the pin within the receptacle. To this end, the receptacle should suitably have a centering or at least a frame, which guides the functional element in an entirely determined position in relation to the receptacle. Then the opening for the pin can be arranged at another place, depending on the type of the required functional element. In this embodiment, a functional element not provided for this mounting situation cannot even be pushed into place. In addition, the message for correct mounting is not even issued.

In another embodiment, the receptacle can be provided with an opening grid, so that each functional element that fits into the receptacle can also be pushed in. However, only one of the openings is provided with a test sensor. Only when a functional element having a pin for this opening is introduced is the positive message of mounting issued. The advantage of this arrangement is simplified production of the assembly station as a standard part that is adapted to the requirements of a particular place on the installation board only by displacing the test sensor.

A further area that can be tested by means of a suitable test sensor are optical characteristics. For this, the test sensor can be, e.g. a colour camera or another colour identifying instrument. By this means, it can be tested whether, at a particular point, a cable with the provided colour is installed or an element fixed on the cable, such as a plug, a cable clip or a winding tape.

An electrically triggerable embodiment of a cable harness production system according to the invention permits the testing of electrical characteristics by means of the test sensor. If the test sensor consists, e.g., of two electrical contacts arranged very close together, then by means of the contact between these two contacts from a stripped end of a cable it can be checked whether an electrically conductive part is available in that a current flows from one electrical contact via the contacted end of the cable into the other electrical contact. Thus, e.g., the presence of a metal plug contact or the successful insulation stripping of a cable end can be demonstrated.

Another very interesting embodiment is proposed by the invention in that an entire length of the cable harness is tested. To this end, one test sensor is required at both ends of the cable to be tested. Each test sensor has an electrical contact, via which it is electrically connected to the respective cable end. To close an electrical circuit, the installation plate in this embodiment requires at least one electrically conductive coating, or is entirely electrically conductive. In addition, the mounting station must be connected to the conductive layer on the installation plate at both ends of the cable to be tested via electrically conductive elements.

Under these conditions, one of the two electronic transmitters in the mounting stations at the end of the cable can trigger a pulse or another electric signal, which can be received by a receiver in the second mounting station, in so far as there is actually a conductive connection between the two test sensors via the cable.

Irrespective of the type of test, which may be mechanical, optical or electrical, the invention provides exclusively an electrical transmission of the test result as test message from each individual mounting station to a receiver in the controller.

In an embodiment preferred by the invention, the test message is emitted as an electrical wave whose frequency is so high that it propagates wirelessly as a radio signal as far as the controller, where it can be received and evaluated.

The decisive advantage of this is that no electrical connection at all is required between the mounting station and controller. The mounting station can thus be screwed at a place, e.g. on a wood or plastic plate. With a displacement of individual mounting stations in an existing cable harness production system, only the mechanical fastening must be detached and restored, which considerably reduces the planning and refitting work.

For the electronic transmitter to emit a radio test message, it requires an energy supply. In an interesting variant, this energy is generated by an electrical generator, which mechanically activates the movement of a functional element during mounting, or the movement of a cable during insertion. E.g., the pin pushed down during the insertion of a functional element can be used for this purpose. If, e.g., a permanent magnet is fixed thereon, which is guided closely along a coil, the magnetic field induces in the electrical coil a current that can be supplied directly to the electronic transmitter. This signal is both the command for beginning transmission as well as the energy to be supplied.

Another suitable principle is a piezo crystal, which emits electrical energy when mechanically stressed.

Alternatively, the energy supply is possible via a battery, for charging which, e.g., a solar module can be provided, which does not require a very large surface area, since it only has to supply the small amount of energy needed to transmit information.

As a further embodiment of the energy supply, the invention proposes that the installation plate is provided with two electrically conductive layer that are insulated from one another and are connected to the two poles of an electrical supply voltage. Each mounting station is electrically connected to these two layers. For this connection, e.g. the fastening means of the mount station on the installation plate is suitable. A very simple embodiment is e.g. screws, which can be screwed with sharp-edged threads into materials such as a chipboard, without drilling. These screws can be pressed through metal foils or thin metal sheets within or on the chipboard, and thereby make an electrical connection. Via an electrically conductive receptacle bore in the mounting station, such a screw makes an electrical connection between an electrically conductive layer of the installation plate and the transmission electronics.

In this case, screws of different lengths contact the less or more distant layer. Here, the screw for the less distant layer must be long enough to reach this layer but by no means project so far into the plate that it also reaches the second layer, which would cause a short circuit.

The second, longer, screw must be long enough that it easily reaches and contacts the more remote conductive layer. So that no short circuit occurs with the already penetrated, first layer, the shaft of the longer screw must be enclosed with an insulating spacer. This arrangement permits the free positioning of a mounting module at each point of the installation plate.

Alternatively, bores or openings can be prepunched in the penetrated upper layer, through which the longer screw is passed without contacting it. If the bores are arranged as a perforated grid, the mounting stations can be freely distributed on the installation board with the accuracy of the grid spacing, the spacers being on the screw shaft not being required.

If in this or a similar manner, an electrical connection is produced between each mounting station and the electrical controller, the invention proposes that the electrical waves for transmitting the test message is transmitted not wirelessly to the controller, but as a signal that is modulated on the supply voltage. This signal can be demodulated in the receiver of the controller, and the transmitted information can be evaluated.

Irrespective of the physical process of transmission of each test message, the controller jointly receives the messages from all mounting stations on the mounting plate. To assign these messages to a particular mounting station, each mounting station must also transmit its identification. Only then can the controller not only recognize that a test message has arrived, but also from which mounting station this message comes. With this additional information, the controller can monitor whether, in the particular step of the production of the cable harness, the test message just received is actually desirable and then subsequently assign it correctly to the test report.

Since each mounting station in a production facility has its own ID, and, with each test message, communicates this to the receiver in the associated electronic controller, there is thereby also the possibility, in the case of a plurality of installation plates in mass production with a plurality of different processing places, of which each has an own controller, of identifying the respective installation plate with the aid of the IDs of the mounting stations located on it, in so far as the controls know which mounting stations are mounted on which installation plate.

In the simplest case, the test message can then be a binary signal, which is then to be interpreted as "present/not present." However, it is also possible to perform a more differentiated test and to transmit the result as a test message, such as, e.g., the magnitude of a resistance.

In the controller, the evaluation of a plurality of incoming test messages is uncritical as long as it is certain that all test messages come together with at least a short time interval between them. However, as soon as two test messages can be received at the same time point, erroneous interpretations are possible. That can occur, e.g., with automated processing of an installation board by two robots. In this case, it is appropriate to use a conventional bus protocol such as Can or Sercos. The electronic parts required for this are used a million-fold and are therefore available at low cost and with high reliability.

In a further advantageous embodiment, the electronic transmitter is also suitable for receiving signals from the controller. In this embodiment, the controller can send messages to each mounting station fitted therewith, which activate optical and/or acoustic and/or mechanical messages there. Possible detectors on the mounting station are, e.g., an LED, a numerical display, an alphanumeric display 46, a buzzer or a mechanically folding-out message area. Thereby, the controller can transmit information and instructions to, e.g., the workforce who manually produce the cable harness, about which mounting station is to be operated next, which functional element is to lie thereon or how a cable is to be laid from one mounting station to another via a plurality of cable installation aids.

As a further function, the command has already been mentioned that a test current is to flow from one mounting station, via a cable of the cable harness, to another mounting station. Thus, in the simplest case, the presence and functioning of an electrical connection can be checked. It is also conceivable to perform a functional test of an electrical functional element and its wiring.

Further details and features of the invention are explained below in greater detail with reference to examples. However, they are not intended to limit the invention but only explain it.

BRIEF DESCRIPTION OF THE DRAWING FIGURE

In schematic view, FIG. 1 shows the perspective view of a section from an installation plate 2 with a total of nine mounting stations 3, of which three are in the diagram centre and, in each case, bear a cable installation aid 32 at the right-hand margin, which in the example shown here is formed as a U-shaped fork. The other six mounting stations 3 each carry a receptacle 31, which provides space for a functional element 5 at the end of at least one cable 41 of the cable harness 4.

DETAILED DESCRIPTION OF THE DRAWING FIGURE

In the embodiment shown here, only the receptacle 31 on the lower, front corner of the illustrated portion of the installation plate 2 still has no functional element 5. By this means, the test sensor 61 becomes visible, in this embodiment a pin that is pressed down against the force of a spring by functional element 5 when it is laid on the support 31.

Approximately in the diagram centre, between the three U-shaped forks, a mounting state 3 is shown, which, on its receptacle 31, supports a functional element 5, which is embodied as a cable clip. It consists of a tape, which is guided around the cable harness and is closed in the slit of a connecting block to form a ring. The connecting block is plugged into an opening in the receptacle 31 by means of a barbed pin (not shown here). Therein a test sensor 61 (also not shown here) tests for the presence of the barbed pin, and therefore of the functional element.

For all nine illustrated mounting stations 3, the respective own transmitter 6 can be seen in the foot. By means of concentric circular segments, the electrical waves are symbolized, which the transmitter 6 emits to transmit the test message 7 to the receiver module in the controller 1. The test message 7 is the result of the test that is performed by the test sensor 61. For the mounting station 3, centre-front, on which no functional element 5 has yet been placed, this test message 7 is thus negative in the processing state shown here.

As an alternative to the energy supply to each individual transmitter 6, in the illustrated embodiment, the foot of each mounting station 3 has two bores, through which a first screw 33 and a second screw 34 fix the mounting station 3 on the installation plate 2. In the illustrated example, the installation plate 2 is provided with a first electrically conductive layer 21 close to the top side and a second electrically conductive layer 22 close to the bottom side. The portion of the plate between these two electrically conductive layers must act as an insulator.

At the cut edge of the installation plate 2, it is easy to see that the first screw 33 may only be so short as to reliably penetrate the first conductive layer 21, so that an electrical contact is produced between this layer and the first screw 33, but not so long as to make a contact with the second conductive layer 22. The second screw 34 must then be long enough to reliably penetrate the second conductive layer 22, but not so long that it unnecessarily emerges again on the rear side of the plate.

So that the second, longer screw 34 not only causes a short circuit between the first (21) and the second electrically conductive layer 22, the upper portion of its shaft must be provided with an insulating spacer, such that, when it reaches the second conductive layer 22, it no longer has an electrical contact with the first conductive layer 21.

Alternatively, a bore can also be punched in the first conductive layer 21, through which the screw 34 is passed without contacting the upper conductive layer 21. These bores should suitably be arranged in a grid on the plate, so that all the desired positions are at least approximately reachable with the accuracy of the grid.

As an example of the function of a cable harness production system according to the invention, no functional element 5 is placed on the frontmost receptacle 31. The cables 41 of the cable harness 4 that lead to this position end in four flat plugs, which are still hanging free in space and waiting for the missing functional element 5. Likewise—as mentioned above—the test sensor 61 is also waiting for this functional element 5.

In FIG. 1, it can be seen that, in the illustrated embodiment and its illustrated mounting state, of the eight drawn mounting stations 3, almost all emit a positive message, in contrast to which the receptacle station 31 shown as frontmost has to issue a negative message in the absence of a functional element 5 disposed thereon.

In FIG. 1, it is easy to see that the cable harness 4 runs at a spacing from the installation plate 2, so that it can be wound with tape at four points.

In FIG. 1, it can be seen that, in the case of a galvanic connection between the controller 1 and the first electrically conductive layer 21, and a second electrically conductive layer with a mains unit for power supply in the controller 1, this connection can also be used for transmitting the test message 7 and the triggering of information and instructions.

In this case, each electronic transmitter 6 converts the test message into an electrical signal such that it is modulated on a carrier frequency, which can be received by all other mounting stations and by the controller. The information contained therein is only decoded and processed in the controller.

In addition, the controller can in turn transmit commands via the same route by means of electrical waves, which are modulated on the power supply and are galvanically transmitted by the controller, via the two electrically conductive layers 21 and 22 of the installation plate 2 and the thereby contacted screws 33 and 34, to the respective connected transmitter/receiver 6 mounting station.

The embodiment of FIG. 1 thus shows an energy supply of each mounting station 3, via a feed to the two electrically conductive layers 21 and 22 of the installation plate 2, which are in each case connected to the short screw 33 and the long screw 34, which, via their metallically conducting receptacle bores, conduct the electrical current further into the foot of the mounting station 3, as far as the electronic transmitter 6.

In FIG. 1, it can be readily seen that each mounting station 3 must have an own ID to be able to produce an unambiguous assignment between an emitted test message 7 and the affected point.

LIST OF REFERENCE CHARACTERS

1 Electronic controller
2 Installation plate
21 First electrically conductive layer of the installation plate 2
22 Second electrically conductive layer of the installation plate 2
3 Mounting station on installation plate 2
31 Receptacle for a functional element 5 as part of the mounting station 3
32 Cable installation aid as part of the mounting station 3
33 First screw for fastening the mounting station 3 on the installation plate 2
34 Second screw for fastening the mounting station 3 on the installation plate 2, longer than the first screw 33
4 Cable harness for fastening the mounting station 3 on the installation plate 2
41 Cable, part of the cable harness 4, guided by means of cable installation aid 32
5 Functional element at the end of a cable 41 and on a receptacle 31
6 Transmitter, electronic, in mounting station 3
61 Test sensor, in mounting station 3, connected to transmitter 6.
7 Test message, received by test sensor 61, and emitted by transmitter 6

The invention claimed is:

1. A cable harness production system, comprising:
an electronic controller;
a cable harness having at least one cable;
an installation plate;
a test sensor;
a plurality of mounting stations being provided on said installation plate with each mounting station of said plurality of mounting stations either supporting a receptacle for a functional element connected to at least one said cable of said cable harness or shaped as a cable installation aid, with at least one mounting station of said plurality of mounting stations having an electronic transmitter with said test sensor assigned thereto, said electronic transmitter being able to be activated by a mounting of said functional element, or by an insertion of a cable of said at least one cable of said cable harness into said cable installation aid, whereupon a test message, emitted as an electric wave, is able to be received by said electronic controller for evaluation.

2. The cable harness production system according to claim 1, wherein said test sensor includes a mechanical trigger.

3. The cable harness production system according to claim 2, wherein said test sensor is mechanically triggered via a pin triggered against a biasing force of a spring by an insertion of said functional element into said receptacle.

4. The cable harness production system according to claim 2, wherein said test sensor is mechanically triggered via a pin triggered against a biasing force of a spring by an insertion of a cable into said cable installation aid.

5. The cable harness production system according to claim 1, further comprising a pin mounted on said functional element and pushable through an opening in said receptacle and onto said test sensor.

6. The cable harness production system according to claim 1, wherein said test sensor is optically triggered.

7. The cable harness production system according to claim 6, wherein said test sensor is triggered by a color recognition device.

8. The cable harness production system according to claim 1, wherein said test sensor is electrically triggered.

9. The cable harness production system according to claim 8, wherein said test sensor has two electrical contacts.

10. The cable harness production system according to claim 8, wherein said test sensor is a first test sensor having an electrical contact for an electrical connection onto a first end of a cable, and further comprising a second test sensor having an electrical contact for an electrical connection onto a second end of said cable, both said first test sensor and said second test sensor, firstly, being connected together via a first electrical transmitter and a second electrical transmitter, respectively assigned thereto, and, secondly, being connected together via respective said mounting stations and an electrically conductive layer on said installation plate, so that an electrical pulse initiated by said first electrical transmitter is receivable by a receiver in said second electrical transmitter when the electrical connection exists between said first test sensor, said cable and said second test sensor.

11. The cable harness production system according to claim 1, further comprising means for fastening a mounting station of said plurality of mounting stations to said installation plate constitute an electrical connection between two conductive layers.

12. The cable harness production system according to claim 1, wherein said electronic transmitter is capable of receiving signals from said electronic controller.

13. The cable harness production system according to claim 1, wherein said electronic transmitter is able to activate a detector on at least one said mounting station of said plurality of mounting stations.

14. The cable harness production system according to claim 13, wherein said detector on said at least one mounting station is an alphanumeric display.

15. The cable harness production system according to claim 1, wherein said cable installation aid is shaped as a fork.

* * * * *